United States Patent [19]

Young

[11] Patent Number: 4,553,108
[45] Date of Patent: Nov. 12, 1985

[54] LOW NOISE FEEDBACK AMPLIFIER

[75] Inventor: James P. Young, Cedar Rapids, Iowa

[73] Assignee: Rockwell International Corporation, El Segundo, Calif.

[21] Appl. No.: 550,271

[22] Filed: Nov. 9, 1983

[51] Int. Cl.[4] .............................................. H03F 3/16
[52] U.S. Cl. .................................... 330/300; 330/311; 330/293
[58] Field of Search ............... 330/277, 291, 293, 300, 330/112, 310, 311

[56] References Cited

U.S. PATENT DOCUMENTS 4,420,724 12/1983 Owen .................................. 330/277

FOREIGN PATENT DOCUMENTS 2461089 7/1975 Fed. Rep. of Germany ...... 330/300

Primary Examiner—James B. Mullins
Assistant Examiner—G. Wan
Attorney, Agent, or Firm—Richard W. Anderson; George A. Montanye; H. Fredrick Hamann

[57] ABSTRACT

A low noise wide bandwidth feedback amplifier is disclosed which enables improved matching and biasing of gallium arsenide field effect transistors. Matching and biasing is considerably simplified by the utilization of a gallium arsenide field effect transistor in conjunction with a bipolar transistor in such a manner that biasing and matching is accomplished with a considerable reduction in cost and component requirements as compared to existing gallium arsenide field effect transistor amplifier circuitries.

5 Claims, 3 Drawing Figures

LOW NOISE FEEDBACK AMPLIFIER

The Government has rights in this invention pursuant to Contract No. F04701-79-C-0083 awarded by the U.S. Air Force.

BACKGROUND OF THE INVENTION

This invention relates generally to signal amplifying circuitry and more particularly to an improved low noise feedback amplifier employing a gallium arsenide field effect transistor.

Advantages of the employment of field effect transistors of the gallium arsenide type are now quite widely exploited in circuitries which function to provide low noise amplification at ultra high frequencies and microwave frequencies. Due to the greater carrier mobility inherent in gallium arsenide field effect transistors, a greater carrier mobility is experienced and transit time is reduced, with the result that high frequency performance improvements are realized.

Because of the low noise, high gain and good dynamic range traits exhibited by field effect transistors, their employment in high performance receiver circuitries is desirable as compared to the employment of bipolar transistors.

Known biasing arrangements for gallium arsenide field effect transistors are complicated by the necessity of preventing high current from reaching the drain electrode of the field effect transistor. Such known biasing methods employ circuitries necessitating numerous components whereby, for example, negative biasing voltage is applied to the gate electrode of the gallium arsenide field effect transistor first, and then followed by the application of positive voltage to the drain. Such biasing methods are also known to employ capacitors and radio frequency chokes in circuit with the biasing source through which the bias potential is applied to the drain and gate electrodes of the gallium arsenide field effect transistor.

It is further realized in the art employing gallium arsenide field effect transistors for wideband operation, that negative feedback is required and that one of the prime areas of difficulty in amplifier design lies in controlling the impedance match between devices.

SUMMARY OF THE INVENTION

Accordingly, the object of the present invention is to provide a new and improved amplifier for high frequency application in a receiver front end where usages impose a wide bandwidth gain characteristic.

A further object of the present invention is the provision of a gallium arsenide field effect transistor amplifier with simplified dc bias requirements as compared to known gallium arsenide field effect transistor amplifier circuitries.

A still further object is the provision of an improved wideband amplifier which provides a reduction in parts requirements and space requirements while providing increased reliability at less cost than known wideband gallium arsenide field effect transistor amplifiers.

The present invention is featured in a circuitry requiring minimal parts and a gallium arsenide field effect transistor in circuit with a bipolar transistor whereby the resulting amplifier may be matched and biased in a simple manner, by utilizing the same components to accomplish both the biasing and the amplification in the circuit.

The present invention further features the provision of an amplifier employing a gallium arsenide field effect transistor which provides a lower input impedance and lower output impedance, thus simplifying matching requirements.

A still further feature of the present invention is provision of an improved and simplified wideband amplifier employing a gallium arsenide field effect transistor which permits the use of a larger value of feedback resistance than prior art feedback circuits utilized for gallium arsenide field effect transistor amplifiers, resulting in a lower noise figure.

These and other features and objects of the present invention will become apparent upon reading the following description with reference to the accompanying drawing, in which:

DETAILED DESCRIPTION OF PREFERRED EMBODIMENTS

Figure 1:
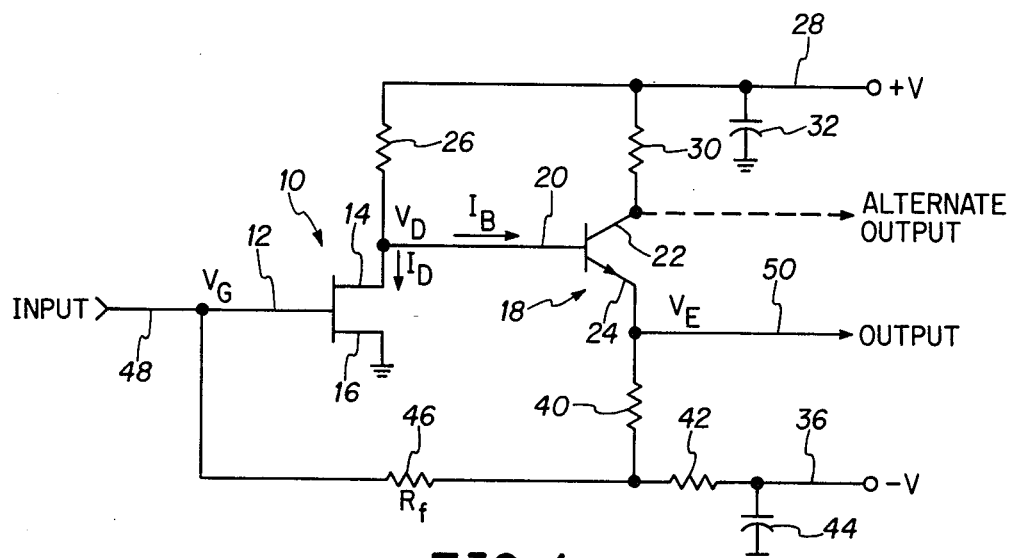
FIG. 1 is a schematic diagram of a first embodiment of a gallium arsenide field effect transistor amplifier in accordance with the present invention.

With reference to FIG. 1, the amplifier to be described is seen to comprise a gallium arsenide field effect transistor 10 in circuit with a bipolar transistor 18. Input 48 is coupled through the gate 12 of field effect transistor 10 which has its drain electrode 14 coupled to the base 20 of bipolar transistor 18. The drain electrode 14 of the gallium arsenide field effect transistor 10 is coupled through resistor 26 to a positive dc biasing voltage source 28, as is the collector electrode 22 of bipolar transistor 18 through resistor 30. Voltage source 28 is coupled through capacitor member 32 to circuit ground. The source electrode 16 of gallium arsenide field effect transistor 10 is connected to system ground. The emitter electrode 24 of bipolar transistor 18 is connected through resistive members 40 and 42 to negative d.c. voltage source 36, with the junction between resistors 40 and 42 being connected through a feedback resistor 46 to the gate electrode 12 of the gallium arsenide field effect transistor 10. Capacitor 44 is connected between the negative biasing source 36 and system ground. An output 50 is taken from the emitter electrode 24 of the bipolar transistor 18. It is thus seen that the bipolar transistor 18 is configured as an emitter follower stage.

The circuit depicted in FIG. 1 controls the bias points for both the gallium arsenide field effect transistor 10 and the bipolar transistor 18. With reference to FIG. 1, if $V_D$ (the voltage on the drain electrode 14 of the gallium arsenide field effect transistor 10) increases due to a change in the gallium arsenide field effect transistor's temperature, for example, $I_B$ (the current flowing into the base electrode 20 of the bipolar transistor 18) will increase. The increase in $I_B$ causes the voltage on the emitter electrode 24 of bipolar transistor 18 to increase which in turn increases $V_G$ (the voltage on the base electrode 12 of gallium arsenide field effect transistor 10). An increase in $V_G$ on the base of field effect transistor 10 forces the drain current $I_D$ to increase which in turn reduces the voltage $V_D$ on the drain electrode of the field effect transistor 10, thus compensating for the assumed increase. Thus, a complicated biasing circuitry is obviated in the improved design in accordance with this invention, since the circuit offers a constant bias point for the field effect transistor and the bipolar transistor so that the small signal parameters remain constant at a given design level.

Improvement to be realized by the amplifier of the present invention at high frequencies may be explained as follows. The feedback resistor 46 provides negative feedback which tends to fix the gain at a given point. Since feedback resistor 46 is connected to the gate 12 of the gallium arsenide field effect transistor, the input impedance of the field effect transistor 10 is lowered. Since gallium arsenide field effect transistors typically have a high input impedance, the lowering of this input inpedance is desirable for matching purposes. The output impedance of a gallium arsenide field effect transistor is also typically high. However, the bipolar transistor 18, being in emitter-follower configuration as shown in FIG. 1, matches to the output of the gallium arsenide field effect transistor 10, and lowers this impedance at the bipolar transistor output 50, because an emitter-follower amplifier has a high impedance input and a low impedance output.

FIG. 1 may be modified by taking the output 50 from the collector 22 of bipolar transistor 18 as shown in dashed line. The output impedance with this modification of FIG. 1 is, however, not lowered as effectively, since the bipolar transistor 18 is no longer in an emitter-follower configuration.

Figure 2:
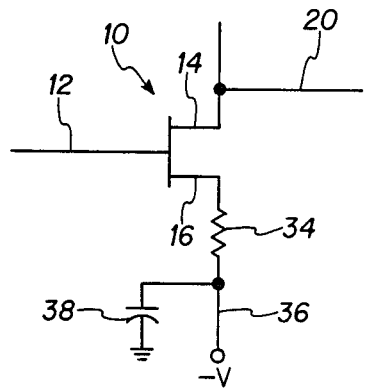
FIG. 2 is a schematic diagram of a modification of the amplifier of FIG. 1.

FIG. 2 shows a modification of the biasing current for field effect transistor 10, where the source electrode 16 of field effect transistor 10 is connected through resistance 34 to negative dc biasing voltage source 36, and biasing source 36 is returned through a capacitor 38 to system ground.

Figure 3:
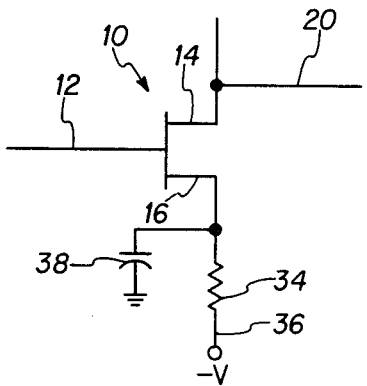
FIG. 3 is a schematic diagram of a further modification of the amplifier of FIG. 1.

A further modification is shown in FIG. 3, where capacitor 38 is connected from the source electrode 16 of field effect transistor 10 to system ground.

Although the present invention has been described with respect to particular embodiments thereof, it is not to be so limited as changes might be made therein which fall within the scope of the invention as defined in the appended claims.

I claim:

1. A feedback signal amplifier consisting of:
   a gallium arsenide field effect transistor having gate, source and drain electrodes;
   a bipolar transistor having base, collector and emitter electrodes, said drain electrode of said field effect transistor being directly connected to said base electrode of said bipolar transistor;
   means for providing a feedback from the emitter of said bipolar transistor to the gate of said field effect transistor; and
   means for biasing said field effect transistor and said bipolar transistor for operation in a signal amplifying range.

2. A feedback signal amplifier comprising:
   a gallium arsenide field effect transistor having gate, source, and drain electrodes;
   an n-p-n bipolar transistor having base, collector, and emitter electrodes, said base electrode of said bipolar transistor being directly connected to the drain electrode of said field effect transistor;
   means for coupling an input signal to the gate of said field effect transistor;
   means for providing a negative feedback from said emitter electrode of said bipolar transistor to the gate electrode of said field effect transistor, said means for providing consisting of a resistive impedance having first and second terminals with said first terminal directly connected to the emitter of said bipolar transistor and a resistive feedback impedance having a first terminal directly connected to the second terminal of said resistive impedance and a second terminal directly connected to the gate of said field effect transistor; and
   means for coupling an output signal from one of said emitter and collector electrodes of said bipolar transistor.

3. The feedback signal amplifier as defined in claim 2, comprising means for applying a dc voltage bias across the drain and source electrodes of said field effect transistor and a further bias across the collector and emitter electrodes of said bipolar transistor.

4. A feedback signal amplifier comprising a gallium arsenide field effect transistor having gate, source and drain electrodes;
   a bipolar transistor having base, collector and emitter electrodes;
   said field effect transistor drain electrode and said bipolar transistor collector electrodes being connected through resistive means to a positive d.c. voltage bias source,
   said field effect transistor drain electrode being directly connected to said bipolar transistor base electrode,
   said bipolar transistor emitter electrode being connected through a resistor means to a negative d.c. voltage bias source,
   means for feeding a portion of the voltage developed across said resistor means through a feedback resistor member to the gate electrode of said field effect transistor,
   said field effect transistor source electrode being connected through one of resistive means and direct connection means to said negative d.c. voltage bias source,
   means for applying an input signal to said field effect transistor gate electrode, and
   output means for receiving an output signal from one of said bipolar transistor collector and emitter electrodes.

5. The feedback signal amplifier as defined in claim 4, wherein said output means receives an output from the emitter electrode of said bipolar transistor.

* * * * *